Nov. 4, 1969
F. L. GITTLER
3,476,621
IMPURITY DIFFUSION SOURCE AND METHOD
Filed March 13, 1967
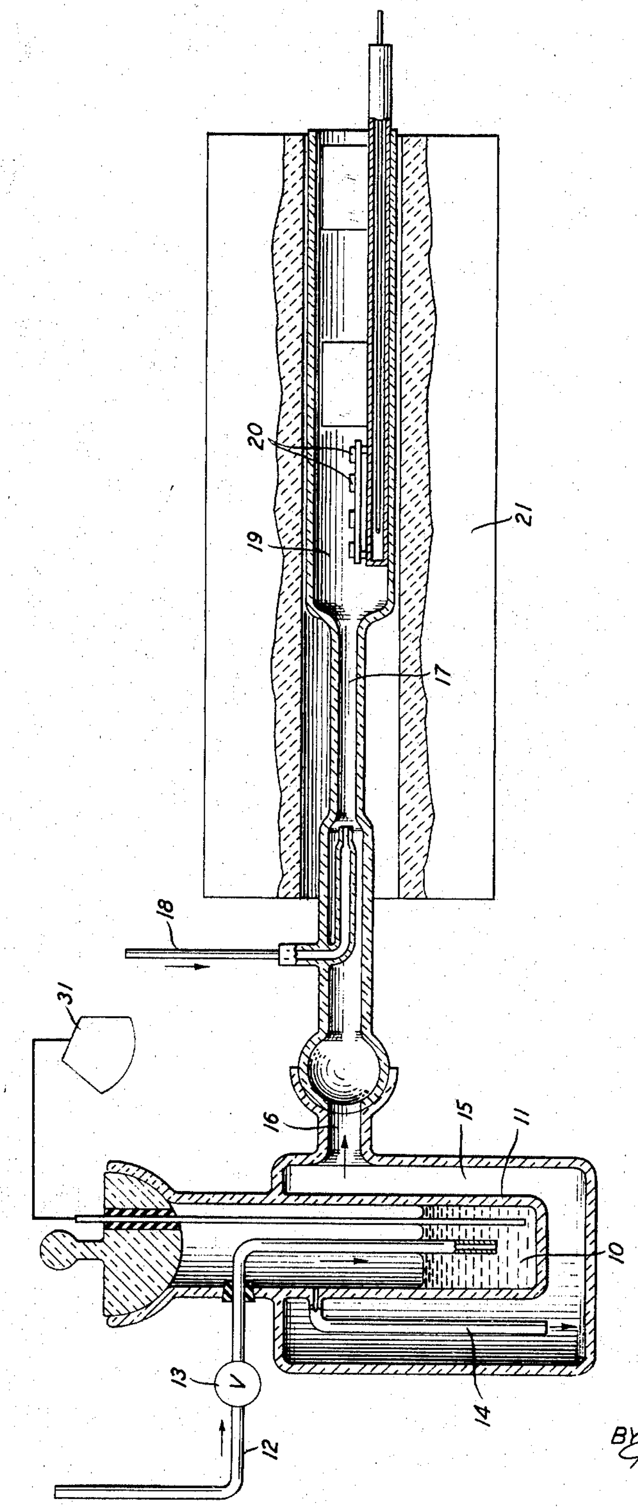
INVENTOR
F. L. GITTLER
BY H. C. Lockhart
ATTORNEY

United States Patent Office 3,476,621

Patented Nov. 4, 1969

3,476,621

IMPURITY DIFFUSION SOURCE AND METHOD

Frank L. Gittler, Allentown, Pa., assignor to Bell Telephone Laboratories, Incorporated, Murray Hill and Berkeley Heights, N.J., a corporation of New York

Filed Mar. 13, 1967, Ser. No. 622,693
Int. Cl. H01l *7/44*
U.S. Cl. 148—189 6 Claims

ABSTRACT OF THE DISCLOSURE

A source for a donor impurity diffusant for vapor-solid diffusion in the fabrication of semiconductor devices comprises a liquid, antimony III ethoxide.

Background of the invention

The invention relates to vapor-solid diffusion of a significant impurity into a semiconductor body to alter the electrical conductivity of the portions of the body thus treated. In particular the invention involves the introduction of a donor impurity, antimony, into a semiconductor body from the vapor state at an elevated temperature.

The solid state diffusion of an impurity element from a vapor to alter or convert the conductivity of portions of a semiconductor body is a well-known technique. In particular the donor impurity, antimony, is advantageous as a diffusant because of its relatively low rate of diffusion, especially inasmuch as it is much lower than the diffusion rate of boron, which is a useful acceptor type diffusant. For many applications, for example, in high frequency semiconductor devices and in devices in which a high surface concentration of impurity is desired, the lesser penetration depth of a slower diffusing impurity is important.

For example in double diffused semiconductor devices, such as high frequency transistors, the movement of an antimony diffusion front during a given diffusion heating time will be a minimum compared to other diffusants, particularly phosphorus, enabling shallower conductivity type zones. Also the slow movement of the antimony enables the accumulation of a higher concentration level near the surface, another advantageous characteristic particularly for certain aspects of integrated circuit fabrication.

In the past, diffusion of antimony from the vapor state has generally been carried out using solid compounds of antimony as sources. For example, antimony trioxide ($Sb_2O_3$) is one solid which has been used for this diffusion. However, the vapor pressure of a solid at a given temperature, generally is lower than that of a liquid. Accordingly, the solid sources generally require the use of relatively high temperatures in order to achieve high concentrations in the semiconductors. These conditions tend to deteriorate the surfaces of the semiconductor slices being treated by causing the carry over of solid particles on the slice surfaces. This latter action apparently results in the formation of a second phase or alloying of a solid compound to produce a surface contaminant which is difficult to remove. Moreover, by their very nature, liquid sources enable a degree of reproducibility and ease of operation not achieved with solid sources.

In accordance with this invention a source of antimony in liquid form of unique characteristics is provided to overcome the foregoing difficulties. Useful liquid compounds of antimony are not readily available. Certain antimony halides, such as antimony pentachloride, ($SbCl_5$) exist in liquid form. However, these compounds tend either to badly etch or stain the semiconductor slice surfaces or to fail to alter the conductivity type of the material depending on the temperature range used. However it has been found that liquid antimony alkoxides and, in particular antimony III ethoxide provide liquid sources of antimony having reasonable vapor pressures at room temperature and which are otherwise particularly suitable for semiconductor device fabrication.

Thus, in accordance with this invention a reservoir containing a quantity of antimony III ethoxide in liquid form is provided near the inlet of a standard diffusion heating furnace containing semiconductor bodies. A stream of nitrogen gas is bubbled through the liquid antimony source and, with the addition of a small percentage of oxygen, the mixture then is fed into the diffusion chamber.

The invention will be better understood from the following detailed description taken in connection with the drawing which is a schematic representation of an open tube diffusion apparatus.

A saturator 11 contains liquid antimony III ethoxide 10 and is maintained at a temperature of about 50 degrees centigrade by the thermostatically controlled infrared heater 31. Nitrogen, functioning as a carrier gas, enters the saturator 11 by way of the supply tube 12 controlled by the valve 13. The liquid antimony compound has a tendency to foam as the nitrogen bubbles through it. For this reason the container of the saturator 11 is made sufficiently tall to allow for such foaming. The nitrogen carrier gas saturated with antimony III ethoxide leaves the saturator 11 through the outlet tube 14 and by way of an outer chamber 15 and through the outlet tube 16.

The carrier gas, saturated with the antimony compound, then passes through the supply tube 16 to the diffusion chamber 19 by way of the mixing chamber 17 into which pure oxygen is introduced through the supply tube 18. The addition of oxygen to enable the formation of silicon oxide is important to impurity diffusion of silicon semiconductor material. Typically, the oxygen is supplied at a very low proportion, for example, the ratio of oxygen to nitrogen by volume may be about 0.02.

In the diffusion chamber 19 an array of semiconductor slices 20 which have been prepared for the diffusion of an N-type impurity are arranged on a suitable mounting. An advantageous arrangement for the diffusion chamber is disclosed in my copending application Ser. No. 569,870, filed Aug. 3, 1966. The diffusion chamber 19 is maintained at an elevated temperature in the diffusion heat treatment range by a furnace 21.

It is advantageous to provide some preheating as disclosed in my application referred to above so as to inhibit condensation from the gas stream in the mixing chamber 17. The temperature in the zone where the oxygen is admitted is about 800 degrees centigrade.

In a particular embodiment for diffusing antimony into silicon a flow rate of saturated carrier gas amounting to 2000 milliliters per minute was found to be advantageous. The ratio of oxygen volume to nitrogen volume was 0.02. Diffusion chamber temperatures typically were maintained in the range from 1200 to 1275 degrees centigrade.

Two particular device fabrication processes are done advantageous using this technique for antimony diffusion. For relatively high frequency use, in the gigahertz range, a PNP transistor having a surface concentration in the base zone of from 6 to $8 \times 10^{18}$ atoms per cubic centimeter and a base junction depth of about 0.65 micron is desired. It will be recognized that this is a relatively high surface concentration for the junction depth recited.

In another application of the liquid antimony diffusion source the buried N-layer diffusion in integrated circuit arrangements requires a surface concentration of at least $2 \times 10^{19}$ atoms per cubic centimeter with minimal penetration. As is known in the art, base spreading resistance is reduced advantageously by providing a lower resistance region in the collector zone of certain transistors in integrated circuit devices of the junction-isolated monolithic type. These low resistance regions, generally termed, buried N-layers, are formed advantageously by a masked N-type diffusion preceding the vapor deposition of an epitaxial layer. This N region advantageously should have a high donor concentration inasmuch as it constitutes, to some extent, a source for a subsequent diffusion into the adjoining epitaxial layer and also ultimately should have a low resistivity.

The following tabulations represent results of antimony diffusion in accordance with this invention and indicate the efficacy of the process for the device applications referred to hereinbefore. Although these treatments employed single crystal silicon having a resistivity of about one ohm centimeter it will be understood that the process is equally applicable to germanium, subject only to an adjustment of temperature because of the lower melting point of that semiconductor. Cleaning procedures well-known in the art were followed in connection with the following reported diffusion processing. For example, slices to be diffused were cleaned for one minute in a mixture of 15 milliliters of hydrofluoric acid (49% conc.) and 100 milliliters of 17 molar ammonium fluoride. They were then rinsed and dried before insertion in the furnace.

The diffusion runs in Table I illustrate the suitability of the liquid antimony source for the base diffusion of high frequency transistors. The results set forth in Table II indicate the application of the process to the "buried layer" type of diffusion.

TABLE I

[Temperature 1,235° C.; Time: 15 minutes]

| | Sheet resistance, ohms per square | Junction Depth, cm. $\times 10^{-4}$ | Surface concentration Sb atoms /cm. $3\times 10^{-18}$ |
|---|---|---|---|
| Run: | | | |
| 1 | 338.4 | .74 | 5.7 |
| 2 | 343.3 | .61 | 8.5 |
| 3 | 329.4 | .88 | 4.2 |
| 4 | 346.6 | .66 | 6.7 |

TABLE II

| | Temp., ° K. | Sheet resistance, ohms per square | Junction depth, cm. $\times 10^{-4}$ | Surface concentration Sb atom cm. $3\times 10^{19}$ |
|---|---|---|---|---|
| Run: | | | | |
| 1 | 1,275.1 | 43.7 | 3.24 | 3.50 |
| 2 | 1,250.6 | 86.6 | 2.36 | 2.87 |
| 3 | 1,225.8 | 127.6 | 1.62 | 2.81 |
| 4 | 1,175.3 | 412.8 | 0.589 | 1.31 |

The diffusion heat treatments represented by the foregoing tabulated results produced semiconductor material of good device quality substantially free of surface deterioration. Moreover the liquid antimony compound, antimony III ethoxide provides a source material which can be handled with considerable facility and safety. This compound may be produced by the reflux of an alcohol and antimony oxide with copper sulfate as described by J. F. Mackey, Journal of Chemical Society, vol. 95, pp. 604–610 (1909) and is available from Alfa Inorganics, 8 Congress St., Beverly, Mass. Other liquid antimony alkoxides may be similarly used such as, for example, antimony III butoxide [$Sb(C_4H_9O)_3$].

Although the invention has been described in terms of certain specific embodiments it will be appreciated that other arrangements may be devised by those skilled in the art which likewise fall within the scope and spirit of the invention.

What is claimed is:

1. The method of altering the conductivity of at least a portion of a semiconductor body by vapor solid diffusion comprising passing a carrier gas through a liquid compound selected from the group consisting of antimony III ethoxide and antimony III butoxide and exposing the surface of said portion of said semiconductor body to the resultant atmosphere.

2. The method in accordance with claim 1 in which the antimony compound is antimony III ethoxide.

3. The method in accordane with claim 1 in which said semiconductor body is one selected from the group consisting of germanium and silicon.

4. The method in accordance with claim 1 in which a small amount of oxygen is added to said atmosphere.

5. The method in accordance with claim 1 in which the temperature of the semiconductor body is maintained at the diffusion heat treatment range during the exposure of the body to said atmosphere.

6. The method in accordance with claim 1 in which said carrier gas is saturated with said antimony compound after passing through said liquid.

References Cited

UNITED STATES PATENTS 3,001,896 9/1961 Marinace ---------- 148—189

L. DEWAYNE RUTLEDGE, Primary Examiner

R. A. LESTER, Assistant Examiner

U.S. Cl. X.R.

148—186, 187, 190; 252—62.3; 260—446